United States Patent
Dubery

(10) Patent No.: US 10,911,046 B2
(45) Date of Patent: *Feb. 2, 2021

(54) CAPACITIVE SENSING

(71) Applicant: Neodrón Limited, Dublin (IE)

(72) Inventor: John Stanley Dubery, Basingstoke (GB)

(73) Assignee: Neodrón Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 16/702,689

(22) Filed: Dec. 4, 2019

(65) Prior Publication Data

US 2020/0220542 A1     Jul. 9, 2020

Related U.S. Application Data

(63) Continuation of application No. 15/388,774, filed on Dec. 22, 2016, now Pat. No. 10,511,305, which is a
(Continued)

(51) Int. Cl.
*H03K 17/96* (2006.01)
*G01D 1/00* (2006.01)
(Continued)

(52) U.S. Cl.
CPC .............. *H03K 17/962* (2013.01); *G01D 1/00* (2013.01); *G01D 5/24* (2013.01); *G01D 15/00* (2013.01);
(Continued)

(58) Field of Classification Search
CPC .............. H03K 17/962; H03K 17/9622; H03K 2217/960725; G01R 29/0878; G01D 1/00; G01D 5/24; G01D 15/00; G01D 21/00
See application file for complete search history.

(56) References Cited

U.S. PATENT DOCUMENTS 3,611,154 A     10/1971   Kupfer
3,769,604 A * 10/1973   Atkinson .................. H03F 3/68
                                                                                                       330/305
(Continued)

FOREIGN PATENT DOCUMENTS

TW       201040501 A    11/2010
WO    2009007500 A1    1/2009
WO    2012129247 A2    9/2012

OTHER PUBLICATIONS

Diode switch, available at https://www.radartutorial.eu/21.semiconductors/hl10.en.html on Feb. 1, 2009 (Year: 2009).*
(Continued)

*Primary Examiner* — Daniel R Miller
(74) *Attorney, Agent, or Firm* — Shami Messinger, PLLC

(57) ABSTRACT

A multi-channel capacitive sensor for measuring the capacitances of a plurality of sense electrodes to a system reference potential. The sensor comprises a sample capacitor having a first terminal and a second terminal, a first diode having a first terminal coupled to the second terminal of the sample capacitor and a second terminal coupled to a first sense electrode, and a second diode having a first terminal coupled to the second terminal of the sample capacitor and a second terminal coupled to a second sense electrode. The sample capacitor and diodes are coupled to a control circuit, e.g. implemented in a microcontroller. The control circuit is operable to apply a drive signal, e.g. a series of voltage pulses, to the first terminal of the sample capacitor while simultaneously applying a bias signal to the second terminal of one or other of the diodes to prevent the diode from conducting the drive signal. Thus charge transfer techniques can be used to measure multiple capacitances while sharing a common sample capacitor. This helps reduce inter-channel drift. Further measurement channels may be added by providing further diodes and corresponding sense electrodes. With three or more channels the scheme requires only one additional control circuit connection per additional channel.

20 Claims, 6 Drawing Sheets

Related U.S. Application Data continuation of application No. 13/537,986, filed on Jun. 29, 2012, now Pat. No. 9,531,380, which is a continuation of application No. 12/395,880, filed on Mar. 2, 2009, now Pat. No. 8,237,456.

(51) Int. Cl.
  *G01D 5/24* (2006.01)
  *G01D 15/00* (2006.01)
  *G01D 21/00* (2006.01)
  *G01R 29/08* (2006.01)

(52) U.S. Cl.
  CPC ......... *G01D 21/00* (2013.01); *G01R 29/0878* (2013.01); *H03K 17/9622* (2013.01); *H03K 2217/960725* (2013.01)

(56) References Cited

U.S. PATENT DOCUMENTS

| | | | |
|---|---|---|---|
| 3,829,850 A | 8/1974 | Guetersloh | |
| 4,099,167 A | 7/1978 | Pomerantz et al. | |
| 4,679,433 A | 7/1987 | Clinton et al. | |
| 5,182,545 A | 1/1993 | Goekler et al. | |
| 5,343,069 A * | 8/1994 | Pluntke | H01L 29/1004 257/496 |
| 5,566,572 A | 10/1996 | Pankow et al. | |
| 5,730,165 A | 3/1998 | Philipp | |
| 6,011,450 A * | 1/2000 | Miya | H01P 1/15 333/103 |
| 6,366,099 B1 | 4/2002 | Mahadeva | |
| 6,466,036 B1 * | 10/2002 | Philipp | G01D 5/24 324/658 |
| 6,762,627 B1 | 7/2004 | Gater | |
| 7,148,704 B2 | 12/2006 | Philipp | |
| 7,327,354 B2 | 2/2008 | Dotson | |
| 7,663,607 B2 | 2/2010 | Hotelling et al. | |
| 7,768,272 B2 | 8/2010 | Kato et al. | |
| 7,804,307 B1 | 9/2010 | Bokma et al. | |
| 7,864,503 B2 | 1/2011 | Chang | |
| 7,875,814 B2 | 1/2011 | Chen et al. | |
| 7,920,129 B2 | 4/2011 | Hotelling et al. | |
| 8,031,094 B2 | 10/2011 | Hotelling et al. | |
| 8,031,174 B2 | 10/2011 | Hamblin et al. | |
| 8,040,326 B2 | 10/2011 | Hotelling et al. | |
| 8,049,732 B2 | 11/2011 | Hotelling et al. | |
| 8,179,381 B2 | 5/2012 | Frey et al. | |
| 8,217,902 B2 | 7/2012 | Chang et al. | |
| 8,723,824 B2 | 5/2014 | Myers et al. | |
| 2003/0038547 A1 * | 2/2003 | Reinhardt | H04Q 3/52 307/113 |
| 2003/0189453 A1 | 10/2003 | Smith et al. | |
| 2004/0001004 A1 | 1/2004 | Chamberlin et al. | |
| 2004/0252426 A1 | 12/2004 | Hargrove et al. | |
| 2005/0068045 A1 * | 3/2005 | Inaba | G01R 27/2605 324/678 |
| 2006/0238233 A1 | 10/2006 | Kraus | |
| 2007/0100566 A1 | 5/2007 | Coley | |
| 2007/0208529 A1 | 9/2007 | Koch et al. | |
| 2007/0252634 A1 * | 11/2007 | Adachi | H01P 1/22 327/365 |
| 2008/0061800 A1 * | 3/2008 | Reynolds | G01R 27/2605 324/678 |
| 2008/0204051 A1 | 8/2008 | Gundlach et al. | |
| 2008/0297175 A1 | 12/2008 | Wu | |
| 2008/0309635 A1 | 12/2008 | Matsuo | |
| 2009/0105975 A1 | 4/2009 | Weber et al. | |
| 2009/0120159 A1 | 5/2009 | Barlesi et al. | |
| 2009/0121778 A1 | 5/2009 | Ceballos et al. | |
| 2009/0224776 A1 | 9/2009 | Keith | |
| 2009/0302315 A1 * | 12/2009 | Lee | H01L 27/2409 257/43 |
| 2009/0315854 A1 | 12/2009 | Matsuo | |
| 2009/0320587 A1 | 12/2009 | Schoenmakers et al. | |
| 2010/0139991 A1 | 6/2010 | Philipp et al. | |
| 2010/0188105 A1 | 7/2010 | Khanna et al. | |
| 2010/0219845 A1 | 9/2010 | Easter | |
| 2010/0283485 A1 | 11/2010 | Vaelisuo et al. | |
| 2011/0187677 A1 | 8/2011 | Klotelling et al. | |
| 2012/0162104 A1 | 6/2012 | Chang et al. | |
| 2012/0242588 A1 | 9/2012 | Myers et al. | |
| 2012/0242592 A1 | 9/2012 | Rothkopf et al. | |
| 2012/0243151 A1 | 9/2012 | Lynch | |
| 2012/0243719 A1 | 9/2012 | Franklin et al. | |
| 2013/0002269 A1 | 1/2013 | Dubery et al. | |
| 2013/0076612 A1 | 3/2013 | Myers | |
| 2014/0267067 A1 | 9/2014 | Fuller et al. | |
| 2014/0285462 A1 | 9/2014 | Lee et al. | |

OTHER PUBLICATIONS

R. R. Spender, B. M. Fleischer, P. W. Barth and J. B. Angell, "A theoretical study of transducer noise in piezoresistive and capacitive silicon pressure sensors," in IEEE Transactions on Electron Devices, vol. 35, No. 8, pp. 1289-1298, Aug. 1988 (Year: 1988).*

Williams, J.A., Touch Sensing Circuit, IP.com Prior Art Database Technical Disclosure, 2005 (Year: 2005).*

J. S. Dubery, U.S. Appl. No. 13/537,986, Amendment to final rejection, dated Aug. 1, 2016.

J. S. Dubery, U.S. Appl. No. 13/537,986, Amendment to Non-final rejection, dated Mar. 11, 2016.

J. S. Dubery, U.S. Appl. No. 13/537,986, Amendment to Non-final rejection, dated May 19, 2014.

J. S. Dubery, U.S. Appl. No. 13/537,986, Amendment to Non-final rejection, dated May 23, 2013.

J. S. Dubery, U.S. Appl. No. 13/537,986, Amendment to Non-final rejection, dated Sep. 25, 2015.

J. S. Dubery, U.S. Appl. No. 13/537,986, Final rejection, dated Aug. 26, 2013.

J. S. Dubery, U.S. Appl. No. 13/537,986, Final rejection, dated Aug. 5, 2014.

J. S. Dubery, U.S. Appl. No. 13/537,986, Final rejection, dated May 31, 2016.

J. S. Dubery, U.S. Appl. No. 13/537,986, Non-final rejection, dated Dec. 11, 2015.

J. S. Dubery, U.S. Appl. No. 13/537,986, Non-final rejection, dated Dec. 19, 2013.

J. S. Dubery, U.S. Appl. No. 13/537,986, Non-final rejection, dated Mar. 27, 2015.

J. S. Dubery, U.S. Appl. No. 13/537,986, Non-final rejection, dated Nov. 23, 2012.

J. S. Dubery, U.S. Appl. No. 13/537,986, Notice of Allowance, dated Aug. 18, 2016.

J. S. Dubery, U.S. Appl. No. 13/537,986, RCE, dated Feb. 4, 2015.

J. S. Dubery, U.S. Appl. No. 13/537,986, RCE, dated Nov. 26, 2013.

LM111/LM211/LM311 Voltage Comparator, p. 1, Jan. 2001.

U.S. Appl. No. 61/454,894, filed Mar. 21, 2011, Rothkopf.

U.S. Appl. No. 61/454,936, filed Mar. 21, 2011, Myers.

U.S. Appl. No. 61/454,950, filed Mar. 21, 2011, Lynch.

* cited by examiner

| Step | S1 | S2 | S3 | S4 | P1 | P2 | comment |
|------|----|----|----|----|------|------|---------|
| 1 | O | X | O | X | LOW | LOW | initial reset |
| 2 | X | O | O | O | HIGH | $V(C_X)$ | charge Cs and Cx |
| 3 | O | O | O | X | $V(C_S)$ | LOW | measure $V(C_S)$ |
| repeat steps 2 and 3 until step n when $V(C_S)$ exceeds $M_{thresh}$ ||||||||

| Step | S1 | S2 | S3 | S4 | S5 | S6 | S7 | S8 | P1 | P2 | P3 | P4 | comment |
|---|---|---|---|---|---|---|---|---|---|---|---|---|---|
| 1 | O | X | O | X | O | X | O | X | LOW | LOW | LOW | LOW | reset |
| 2 | X | O | O | O | O | O | X | O | HIGH | $V(C_{x1})+V_d$ | $V(C_{x1})$ | HIGH | charge Cs and Cx1 |
| 3 | O | O | O | X | O | X | X | O | $V(C_S)$ | LOW | LOW | HIGH | measure $V(C_S)$ & remove charge from Cx1 |
| | | | | | | | | | repeat steps 2 and 3 until step 1+2n1 when $V(C_S)$ exceeds $M_{thresh}$ | | | | |
| 1+2n1+1 | O | X | O | X | O | X | O | X | LOW | LOW | LOW | LOW | reset |
| 1+2n1+2 | X | O | O | O | X | O | O | O | HIGH | $V(C_{x2})+V_d$ | HIGH | $V(C_{x2})$ | charge Cs and Cx2 |
| 1+2n1+3 | O | O | O | X | X | O | O | X | $V(C_S)$ | LOW | HIGH | LOW | measure $V(C_S)$ & remove charge from Cx2 |
| | | | | | | | | | repeat steps (1+2n1+2) and (1+2n1+3) until step (1+2n1+1+2n2) when $V(C_S)$ exceeds $M_{thresh}$ | | | | |

Fig. 5

CAPACITIVE SENSING

This application is a continuation of and claims the benefit of priority to U.S. patent application Ser. No. 15/388,774, filed Dec. 22, 2016, now U.S. Pat. No. 10,511,305, which is a continuation of application Ser. No. 13/537,986, filed Jun. 29, 2012, now U.S. Pat. No. 9,531,380, which is a continuation of application Ser. No. 12/395,880, filed Mar. 2, 2009, now U.S. Pat. No. 8,237,456, the contents of all of which are incorporated herein by reference in their entirety.

BACKGROUND ART

This invention relates to capacitive sensing for sensing the presence or touch of an object adjacent to a sensor. In particular, the invention relates to multi-channel capacitive sensing.

Capacitive sensors have recently become increasingly common and accepted in human interfaces and for machine control, e.g. for providing touch sensitive buttons for activating functions of a device being controlled. Capacitive position sensors also find use in non-interface applications, e.g. in fluid level sensing applications.

FIG. 1 schematically shows a known type of capacitive sensor 2 which may be operated in accordance with the charge transfer techniques described in U.S. Pat. No. 5,730,165 and/or U.S. Pat. No. 6,466,036. The sensor is for measuring the capacitance Cx of a sense electrode 4 to a system reference potential (ground). The capacitance provided by the sense electrode to the system ground potential may thus be considered as being equivalent to a capacitor having capacitance Cx with one terminal connected to ground, and may be referred to as a sense capacitor.

The specific application for the sensor 2 is not significant for the purposes of this description. However, in this example it is assumed the sensor 2 is used to detect the presence of a pointing finger 8 adjacent the sense electrode 4. When there is no finger adjacent the sense electrode 4 its capacitance to ground is relatively small. When there is a finger adjacent the sense electrode 4 (as in FIG. 1), the sense electrode's capacitance to ground is increased as the pointing object provides a capacitive coupling Cx to a virtual ground. Thus changes in the measured capacitance of the sense electrode are indicative of changes in the presence of an adjacent object (e.g. a finger in a touch sensitive control, or a fluid in a level sensor). The sensor of FIG. 1 is a single-channel sensor in that it is operable to measure the capacitance of a single sense electrode 4.

In addition to the sense electrode 4, the sensor 2 comprises a microcontroller 6 and a sample capacitor Cs. The microcontroller 6 is a general purpose programmable device configured to provide the below-described functionality.

The provision of the sensing channel requires the use of two pins of the microcontroller 6, and these are labelled P1 and P2 in FIG. 1. The pins P1 and P2 of the microcontroller 6 may be driven high or low in a defined sequence as the controller executes its program in the usual way. This is schematically represented in FIG. 1 by a series of switches S1, S2, S3 and S4 within the microcontroller 6. Switch S1 selectively connects pin P1 to the microcontroller's operating logic level +V—this corresponds to the action of driving pin P1 high. Switch S2 selectively connects pin P1 to the microcontroller's system reference potential (ground)—this corresponds to the action of driving pin P1 low. Only one or other (or neither) of S1 and S2 can be closed at any one instant. Switches S3 and S4 similarly selectively drive pin P2 high or low as required.

In addition to being operable to be drive pin P1 high or low in accordance with its program instructions, the microcontroller is also operable to provide a measurement channel M connected to pin P1 (i.e. pin P1 is an I/O pin). The measurement channel comprises a simple comparator arranged to compare an input voltage on pin P1 with a threshold level $M_{thresh}$. Typically the threshold level might be half the microcontroller's operating voltage (i.e. $M_{thresh}=+V/2$).

The sample capacitor Cs is connected between pins P1 and P2. The sense electrode 4 is connected to pin P2.

FIG. 2 shows a table which schematically represents a switch operating sequence for the sensor of FIG. 1 for measuring the capacitance of the sense electrode 4 to system ground. The sequence operates in a series of steps starting at step 1, as indicated in the left-hand column. The columns headed S1 to S4 indicate the status of the respective switches in each step. An "X" in the table indicates the corresponding switch is closed, while an "O" indicates the corresponding switch is open. The columns headed P1 and P2 indicate the voltage level of the corresponding pins at each step. A table entry "LOW" indicates the corresponding pin is driven low, a table entry "HIGH" indicates the corresponding pin is driven high, where the pin is not driven high or low, its "free" voltage level is indicated. The final column provides brief comments on the step.

Step 1 is an initialisation/reset step. Switches S2 and S4 are closed so that pins P1 and P2 are both driven low. This in effect grounds the sense electrode 4 and shorts out the sample capacitor Cs so that there is no charge residing on either.

Step 2 is a charging step in which only switch S1 is closed. Thus pin P1 is driven high while pin P2 is free to float. The voltage +V provided on pin P1 thus charges the in-series combination of the sample capacitor Cs and the sense capacitor Cx.

The sample capacitor Cs and the sense capacitor Cx provide a capacitive divider between +V and ground. The voltage on pin P2 at the capacitors' common connection is the voltage across Cx (i.e. V(Cx)). This depends on the relative capacitances Cs and Cx. I.e. $V(Cx)=V*Cs/(Cs+Cx)$ in accordance with the well-known capacitor divider relationship. The voltage across the sample capacitor Cs is V(Cs) where $V(Cs)=V-V(Cx)$. I.e. $V(Cs)=V*(Cx/(Cs+Cx))$.

Step 3 is a measuring step in which only switch S4 is closed. Thus pin P1 is free to float and pin P2 is driven low. Driving pin P2 low means (i) the charge on Cx is removed (sunk to ground), and (ii) pin P1 achieves the voltage V(Cs) established across the sample capacitor Cs during the charging step 2. Thus the voltage on pin P1 is $V(Cs)=V*(Cx/(Csi-Cx))$. The voltage on P1 thus depends on the capacitance of the sense capacitor Cx provided by the sense electrode 4. In principle, this voltage may be measured to provide an indication of the capacitance of the sense capacitor. However, in practice the voltage V(Cs) provided by the single charging cycle in step 2 will be small (because Cx<<Cs). Thus to provide a more robust measure of capacitance Cx the senor 2 is operable to repeatedly execute steps 2 and 3 (i.e. without performing the reset step 1). In each repetition of steps 2 and 3 a discrete increment of charge is added to the sample capacitor. Thus the voltage V(Cs) after each iteration of steps 2 and 3 increases asymptotically in dependence on the magnitude of the sense capacitor Cx (the increase is asymptotic because less charge is added in subsequent iterations because of the charge already on the sample capacitor Cs).

After a number of these charge cycles (i.e. a burst of pulses), the voltage on pin P1 may be measured and taken as an indicator of Cx. However, this requires the measurement channel M of the microcontroller 6 which is associated with pin P1 to have the capability of measuring an analogue voltage. This requires relatively complex circuitry. Thus it is common not to burst for a fixed number of pulses, but to simply keep bursting (i.e. iterating steps 2 and 3) until the voltage V(Cs) reaches a measurement threshold $M_{thresh}$, e.g. where typically $M_{thresh}=V/2$. The number of charging cycles required for the voltage across the sample capacitor Cs to exceed the measurement threshold (as determined by a simple comparator) is an (inverse) measurement of the capacitance to ground of the sense electrode, and hence indicative of the proximity or otherwise of an object. The "variable burst length" scheme has the advantage over "fixed burst length" schemes of using a comparator instead of a more complex voltage measurement function. Nonetheless, both schemes are found to provide robust and reliable measurements of relatively small capacitances.

The sensor in FIG. 1 is a single channel sensor capable of measuring the capacitance of a single sense electrode. However, in many applications there is a desire to measure the capacitances of two or more sense electrodes, i.e. there is a desire to provide a multi-channel capacitive sensor. For example, the designer of a device employing a capacitive sensor user interface will typically wish to provide more than one touch sensitive button. Furthermore, in other applications it is common to provide a reference channel in parallel with a "real" sense channel. For example, in a fluid level application, a reference channel may be associated with a reference sense electrode located at the bottom of a container such that it is always adjacent fluid in the container. A sense electrode associated with the "real" sense channel may be placed midway up the container. The measured capacitance of the sense electrode associated with the "real" sense channel will depend on whether the fluid in the container is above or below the midway point (i.e. whether or not it is adjacent the sense electrode). However, the absolute measure capacitance values will in general vary widely depending on sensor tolerance, drifts, and properties of the fluid being sensed. Thus it may be difficult to determine based solely on an absolute measurement of capacitance whether or not the sense electrode of the "real" sense channel is adjacent fluid in the container. However, by providing the parallel reference channel, the capacitance determined by the "real" sense channel may be compared to that determined by the reference channel. If they are similar, it can be assumed the container is more than half full, if they are significantly different, it can be assumed the container is less than half full.

FIG. 3 schematically shows a known dual-channel capacitive sensor 12. The sensor 12 is for measuring first and second capacitances Cx1, Cx2 of first and second sense electrodes 14-1, 14-2 to a system reference potential (ground). The dual-channel sensor 12 of FIG. 3 provides two sense channels by simply duplicating the sense channel of FIG. 1. The sensor 12 requires four pins P1, P2, P3, P4 of a suitably programmed microcontroller 16, and two sample capacitors Cs1, Cs2. The sense channels associated with the respective sense electrodes 14-1, 14-2 are in effect completely independent of one another and each operates individually in the manner described above for the sensor shown in FIG. 1.

Sensors having still more channels can be provided by adding further replications of the single sensor channel shown in FIG. 1. However, the inventors have identified drawbacks of simply using n independent replications of the single sensor channel of FIG. 1 to provide an m-channel capacitive sensor. For example, with this approach each sensor channel requires two connections to the controller so a total of 2 m connections, e.g. microcontroller pins, are required for an m-channel sensor. Furthermore, the inventors have found the independent nature of the sense channels can lead to problems with inter-channel consistency. For example, different drifts between the different channels are common, e.g. because the channels have their own different sample capacitors, and these are typically relatively (and differently) sensitive to changing environmental conditions, such as temperature.

In some cases the differently varying channel responses associated with known multi-channel sensors will not be considered overly problematic. For example this might be the case where each channel is primarily for identifying temporal changes in its own signal, such as in a simple bi-state proximity sensor application. In these cases comparison with other channels is not needed and so the changing relative responses of different channels is not a concern. However, in some cases the relative signals from a pair of channels will be the primary parameter of interest. For example, where one channel is for providing a reference signal for comparison with another channel, such as might be the case in a fluid sensor application.

Accordingly there is a need for multi-channel capacitive sensors which provide for reduced relative drift between channels and which also require fewer connections with increasing numbers of channels than known multi-channel sensors.

SUMMARY OF THE INVENTION

According to a first aspect of the invention there is provided a multi-channel capacitive sensor for measuring the capacitances of a plurality of sense electrodes to a system reference potential, the sensor comprising: a sample capacitor having a first terminal and a second terminal; a first diode having a first terminal coupled to the second terminal of the sample capacitor and a second terminal coupled to a first sense electrode; a second diode having a first terminal coupled to the second terminal of the sample capacitor and a second terminal coupled to a second sense electrode; and a control circuit operable to apply a drive signal to the first terminal of the sample capacitor and to apply a bias signal to the second terminal of the first and/or second diodes so as to selectively prevent the first and/or second diodes from conducting the drive signal.

Thus in accordance with embodiments of the invention, the capacitances of two or more sense electrodes can be measured using the same sample capacitor and drive channel circuitry for each measurement. This can help reduce inter-channel drifts and so allow for more reliable comparison between measured capacitances, for example.

The first terminals of the diodes may be anodes and the second terminals cathodes with the drive signal comprising a positive-going signal relative to the system reference potential. Here the bias signal may comprise a positive signal applied to the respective diodes' cathodes. Alternatively, the first terminals of the diodes may be cathodes and the second terminals anodes with the drive signal comprising a negative-going signal relative to the system reference potential. Here the bias signal may comprise a negative signal applied to the respective diodes' anodes.

The control circuit may be further operable to temporarily couple the first and/or second sense electrodes to the system reference potential so as to selectively remove charge coupled to the first and/or second sense electrodes by the drive signal. This allows for repeated charge accumulation cycles in accordance with the general principles of charge-transfer based capacitive sensing.

The control circuit may be further operable to temporarily apply a common reset signal to both terminals of the sample capacitor to remove charge accumulated on the sample capacitor by the drive signal. This can initialise the sensor prior to a capacitance measurement. This may be done in conjunction with coupling the first and/or second sense electrodes to the system reference potential to remove any residual charge on these elements.

The control circuit may be further operable to measure a signal indicative of an amount of charge coupled to the sample capacitor by the drive signal.

The control circuit may be operable to couple the second terminal of the sample capacitor to the system reference potential while measuring the signal indicative of an amount of charge coupled to the sample capacitor by the drive signal. This provides a simple way of measuring, for example, the voltage across the sample capacitor.

The drive signal may comprise one or more voltage transitions. The control circuit may be operable to couple the second terminal of the sample capacitor to the system reference potential after each voltage transition.

The signal indicative of an amount of charge coupled to the sample capacitor by the drive signal may be a measure of the voltage on the sample capacitor after the controller has applied a predetermined number of voltage transitions. Alternatively, the signal indicative of an amount of charge coupled to the sample capacitor by the drive signal may be a count of a number of voltage transitions applied by the control circuit before a measure of the voltage on the sample capacitor exceeds a measurement threshold.

The control circuit may be further operable to compare a measurement of the capacitance of the first sense electrode with a measurement of the capacitance of the second sense electrode.

The control circuit may be further operable to provide an output signal indicative of a measurement of the capacitance of the first and/or second sense electrode and/or a signal indicative of a comparison of a measurement of the capacitance of the first sense electrode with a measurement of the capacitance of the second sense electrode.

The multi-channel capacitive sensor may further comprise a third diode having a first terminal coupled to the second terminal of the sample capacitor and a second terminal coupled to a third sense electrode, wherein the control circuit is further operable to apply a bias signal to the second terminal of the third diode so as to selectively prevent the third diode from conducting the drive signal.

More generally, the multi-channel capacitive sensor may further comprise at least one further diode having a first terminal coupled to the second terminal of the sample capacitor and a second terminal coupled to a one of a corresponding at least one further sense electrode wherein the control circuit is further operable to apply a bias signal to one or more of the at least one further diode so as to selectively prevent the at least one further diode from conducting the drive signal.

The control circuit may comprise a microcontroller.

According to a second aspect of the invention there is provided a device comprising a multi-channel sensor according to the first aspect of the invention.

The device may, for example, include a touch-sensitive user interface where the sense electrodes provide touch sensitive areas. In another example the sensor may be used in a level-sensing application. For example, the device may comprise a receptacle for housing a variable quantity of a material, and the multi-channel sensor may be arranged so that the capacitance of the first sense electrode depends on a level of the material in the receptacle and the capacitance of the second sense electrode does not depend on a level of the material in the receptacle, whereby a measurement of the capacitance of the second sense electrode provides a reference measurement for comparison with a measurement of the capacitance of the first sense electrode.

According to a third aspect of the invention there is provided a method of measuring the capacitances of a plurality of sense electrodes to a system reference potential, the method comprising: providing a sample capacitor having a first terminal and a second terminal; providing a first diode having a first terminal coupled to the second terminal of the sample capacitor and a second terminal coupled to a first sense electrode; providing a second diode having a first terminal coupled to the second terminal of the sample capacitor and a second terminal coupled to a second sense electrode; applying a drive signal to the first terminal of the sample capacitor; and applying a bias signal to the second terminal of the first and/or second diodes so as to selectively prevent the first and/or second diodes from conducting the drive signal.

BRIEF DESCRIPTION OF THE DRAWINGS

For a better understanding of the invention and to show how the same may be carried into effect reference is now made by way of example to the accompanying drawings in which:

FIG. 5 is a table schematically representing a switch operating sequence for the capacitive sensor of FIG. 4;

DETAILED DESCRIPTION

Figure 4:
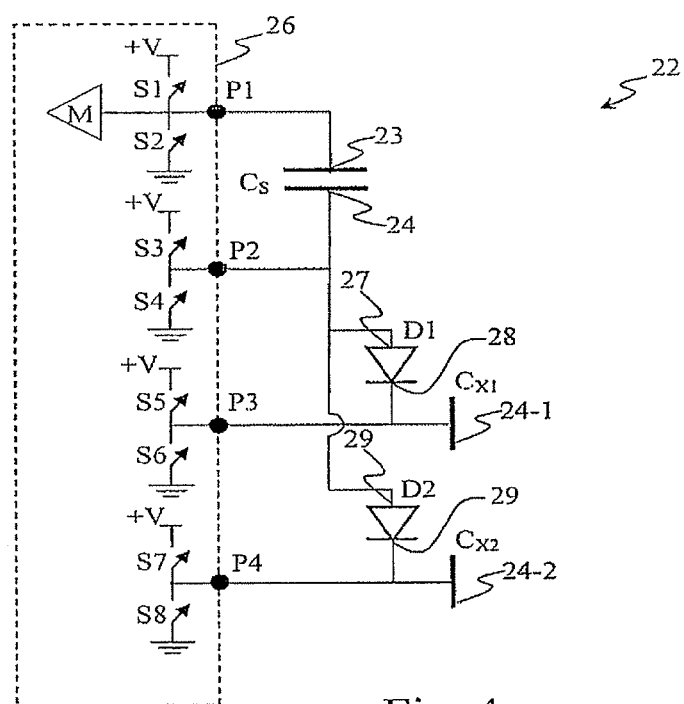
FIG. 4 schematically shows a dual-channel capacitive sensor according to an embodiment of the invention.
Figure 6A:
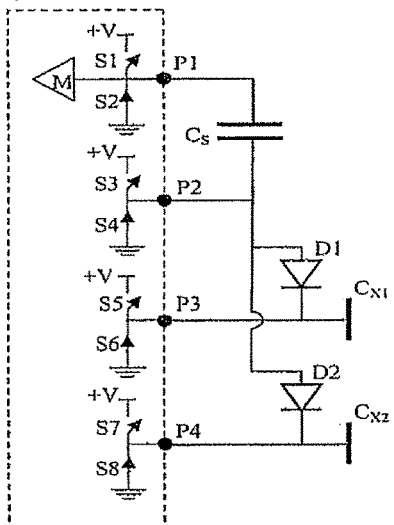
FIGS. 6A-6E schematically show the capacitive sensor of FIG. 4 at different stages of the switch operating sequence of FIG. 5.
Figure 6B:
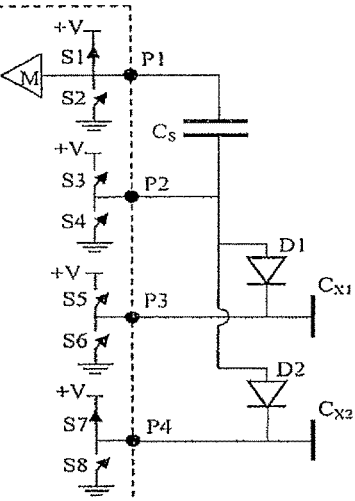
Figure 6C:
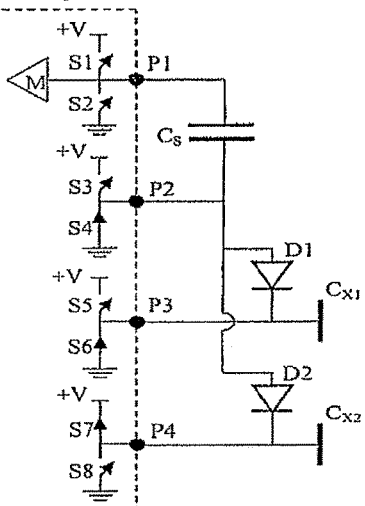
Figure 6D:
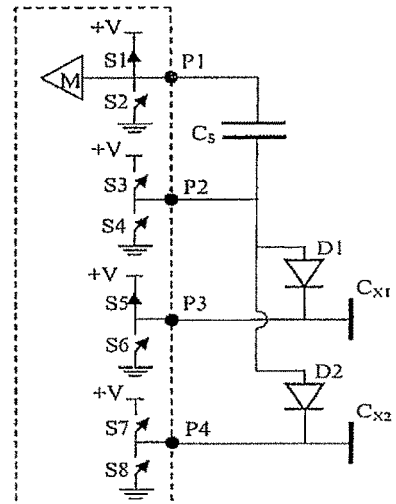
Figure 6E:
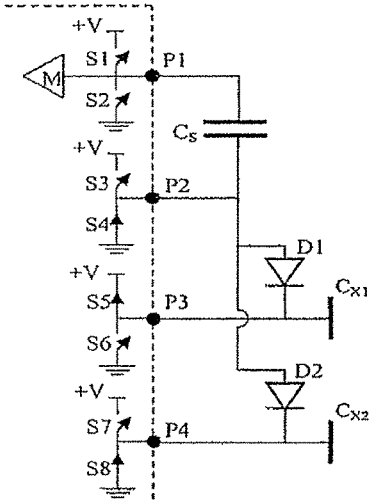

FIG. 4 schematically shows a multi-channel capacitive sensor 22 according to an embodiment of the invention. The sensor 22 in this example is a dual-channel sensor. A dual-channel sensor is the simplest form of multi-channel sensor and so is focused on here for ease of explanation. It will be appreciated, however, that embodiments of the invention may be extended to incorporate higher numbers of sensing channels, as explained further below.

The sensor 22 is for measuring the capacitances of first and second sense electrodes 24-1, 24-2 to a system reference potential (ground). The capacitances provided by these respective sense electrodes to the system ground may be considered as being equivalent to capacitors having capacitances $Cx1$ and $Cx2$ respectively with each capacitor having one of its terminals connected to a virtual ground. These capacitors may be referred to as sense capacitors. In addition to the sense electrodes 24-1, 24-2, the sensor 22 comprises a microcontroller 26, a sample capacitor Cs, and first and second diodes D1, D2. The microcontroller 26 is a general purpose programmable device configured, in conjunction with the sample capacitor Cs and diodes D1, D2, to provide the below-described functionality for providing signals indicative of the capacitances of the sense electrodes 24-1, 24-2.

The specific application for the sensor 22 is not significant for the purposes of this description. However, in this example it is assumed the sensor 22 is used in a fluid-level sensing application in which the first sense channel (associated with the first sense electrode) is arranged to provide a fluid-level sense channel and the second sense channel (associated with the second sense electrode) is arranged to provide a reference channel. Thus in one embodiment the first sense electrode may be arranged so that its capacitance to ground depends on the level of a fluid in a receptacle, e.g. petrol in a petrol tank, while the second sense electrode is arranged so that its capacitance to ground does not depend on the level of fluid in the receptacle. E.g. in a simple application the first sense electrode may be located mid-way up a side wall of the receptacle. The capacitance of the electrode depends on whether fluid is adjacent the electrode—i.e. whether the receptacle is more or less than half full. The second sense electrode may be located on a bottom wall of the receptacle. The capacitance of this electrode is the same regardless of whether the receptacle is more or less than half full (so long as the receptacle is not completely empty). The provision of the reference channel avoids the need to rely on an absolute measurement of the capacitance of the first electrode. This is advantageous since, as noted above, an absolute capacitance measurement can vary significantly depending on circuit element tolerances, changing environmental conditions, and the nature of the fluid being sensed. Thus comparison of a fluid-level dependent signal with a fluid-level independent signal (reference signal) measurement from a reference channel is preferred. This is because in providing the parallel reference channel, the capacitance determined by the fluid-level sense channel may be compared to that determined by the reference channel. If the two capacitances are similar (or close to an expected ratio depending on electrode geometry), it can be assumed the receptacle is more than half full, if they are significantly different (or far from the expected ratio for a full receptacle), it can be assumed the container is less than half full.

However, as mentioned above the specific application for the sensor 22 is not overly significant. For example, the dual-channel sensor 22 of FIG. 4 could equally be used to provide two "touch buttons" along the lines of the application of the sensor 12 shown in FIG. 3. In general sensors in accordance with embodiments of the invention may find application in any of the ways known capacitive sensors may be used. That is to say, capacitive sensors in accordance with embodiments of the invention may be employed in any of the same circumstances in which known capacitive sensors are used. What is more, so far as any external circuitry is concerned (e.g. a master controller of a device in which the capacitive sensor is implemented), capacitive sensors according to embodiments of the invention may interface with the external circuitry in the same was as for a conventional capacitive sensor.

The provision of the two sensing channel requires the use of four pins of the microcontroller 16, and these are labelled P1, P2, P3 and P4 in FIG. 4. The pins of the microcontroller 16 may be driven high or low in a defined sequence as the controller executes a program in the usual way. This is schematically represented in FIG. 4 by a series of eight switches S1 to S8 within the microcontroller 16. Switch S1 selectively connects pin P1 to the microcontroller's operating logic level +V—this corresponds to the action of driving pin P1 high. Switch S2 selectively connects pin P1 to the microcontroller's system reference potential (ground)—this corresponds to the action of driving pin P1 low. Only one or other (or neither) of S1 and S2 can be closed at any one instant. Switches S3 and S4, S5 and S6, and S7 and S8 similarly selectively drive pins P2, P3 and P4 high or low as required.

In addition to being operable to be drive pin P1 high or low in accordance with its program instructions, the microcontroller is also operable to provide a measurement channel M connected to pin P1 (i.e. pin P1 is an I/O pin). The measurement channel in this embodiment comprises a simple comparator arranged to compare an input voltage on pin P1 with a threshold level $M_{thresh}$. Typically the threshold level might be half the microcontroller's operating voltage (i.e. $M_{thresh}$=+V/2).

The sample capacitor Cs has a first terminal 23 and a second terminal 24. The first terminal 23 is connected to pin P1 of the microcontroller and the second terminal 24 is connected to pin P2.

The first diode D1 has a first terminal 27 and a second terminal 28. In this example the first terminal is the anode and the second terminal is the cathode. The anode 27 of the first diode D1 is electrically coupled, e.g. directly connected, to the second terminal 24 of the sample capacitor (and hence is also coupled to pin P2 of the microcontroller 16). The cathode 28 of the first diode D1 is coupled to the first sense electrode 24-1 and also to pin P3 of the microcontroller 16.

The second diode D2 has a first terminal 29 and a second terminal 30. In this example the first terminal is the anode and the second terminal is the cathode. The anode 29 of the second diode D2 is electrically coupled to the second terminal 24 of the sample capacitor (and hence is also coupled to pin P2 of the microcontroller 16 and the anode 27 of the first diode). The cathode 30 of the second diode D2 is coupled to the second sense electrode 24-2 and also to pin P4 of the microcontroller 16.

Figure 3:
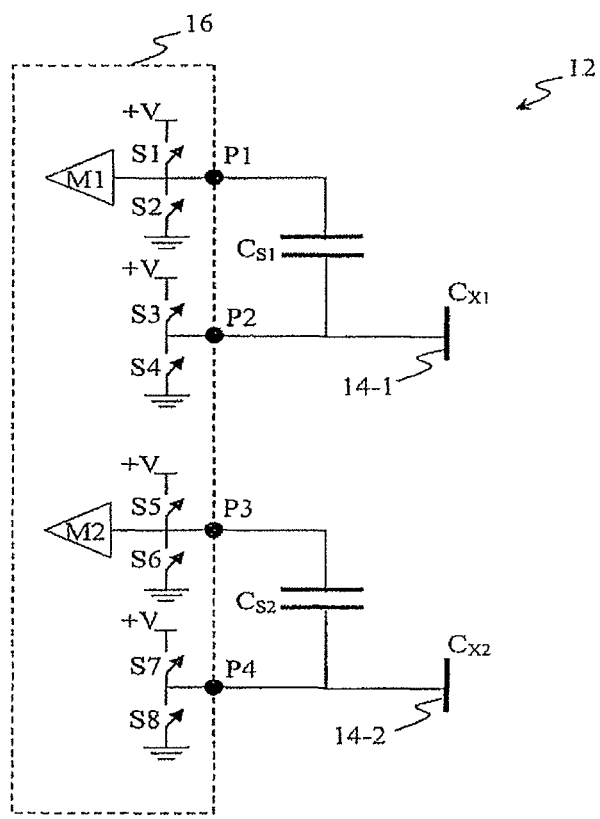
FIG. 3 schematically shows a known dual-channel capacitive sensor.

The general principle underlying the dual-channel sensor 22 of FIG. 4 is that the controller 16 may selectively apply bias signals via pins P3 and P4 to the corresponding diodes D1 and D2 so that the diodes can be selectively prevented from conducting a drive signal provided via pin P1. In effect this allows a single drive channel (provided via pin P1 in broadly conventional manner for a charge-transfer based capacitive sensor) and a single sample capacitor Cs to be used in measuring the capacitances of multiple sense electrodes. The drive signal may be coupled to a selected single one of the sense electrodes to measure the capacitance of that electrode by biasing the diode of the other electrode so that it does not conduct the drive signal. The capacitances of the different sense electrodes may be measured in turn with appropriate biasing of the different diodes. Advantageously, and unlike the sensor 12 shown in FIG. 3, the different measurements of the different capacitances of the different sense electrodes each rely on the same sample capacitor and drive channel. Providing an increased level of circuit element commonality in this way helps to provide reduced inter-channel drift. For example, effects from differences in temperature dependence of the capacitances of the two sample capacitors Cs1 and Cs2 in the sensor 12 of FIG. 3 are avoided in embodiments of the invention.

In addition, and as explained further below, the use of a single common sample capacitor for each sense channel reduces the extra number of control circuit connections (microcontroller pins) required per additional sense channel. Adding a third sense channel to the conventional-type multi-channel sensor 12 of FIG. 3 requires two more pins. Adding a third sense channel to a multi-channel sensor in accordance with embodiments of the invention may be done using only one additional connection/pin (i.e. a connection to provide the bias signal for the third diode/reset signal for the third sense electrode).

FIG. 5 shows a table which schematically represents a switch operating sequence for the sensor 22 of FIG. 4 for measuring the capacitances of the sense electrodes 24-1, 24-2 to system ground in accordance with an embodiment of the invention. The sequence operates in a series of steps starting at step 1, as indicated in the left-hand column. The columns headed S1 to S8 indicate the status of the respective switches in each step. An "X" in the table indicates the corresponding switch is closed, while an "O" indicates the corresponding switch is open. The columns headed P1-P2 indicate the voltage level of the corresponding controller pins at each step. A table entry "LOW" indicates the corresponding pin is driven low by the controller, a table entry "HIGH" indicates the corresponding pin is driven high by the controller, where the pin is not driven high or low, its "free" voltage level is indicated. The final column provides brief comments on the step. FIGS. 6A to 6E schematically show the sensor 22 of FIG. 4 at different steps in the switch operating sequence as now explained. In this example it will be assumed the capacitance of the first sense electrode is measured first and the capacitance of the second sense electrode is measured second.

Step 1 (represented in FIG. 6A) is an initialisation/reset step. Switches S2, S4, S6 and S8 are closed so that pins P1, P2, P3 and P4 are all driven low. This in effect grounds both sense electrodes 24-1, 24-2 and shorts out the sample capacitor Cs so that there is no charge residing on any of these.

Step 2 (represented in FIG. 6B) is a charging step for the first sense channel associated with the first sense electrode. In this step switches S1 and S7 are closed. All the other switches are open. Thus pins P1 and P4 are driven high while pins P2 and P3 are free to float. The voltage +V provided on pin P1 thus charges the in-series combination of the sample capacitor Cs and the first sense capacitor Cx1 provided by the capacitance of the first sense electrode to ground. This charging relies on the forward conduction of the drive signal (i.e. the voltage transition on pin P1 from the system reference potential (ground) to +V) by the first diode D1. The drive signal is not conducted by the second diode D2 because pin P4 is driven high to provide a bias signal that prevents the second diode D2 from forward conducting the drive signal.

Thus in this step the sample capacitor Cs and the first sense capacitor Cx1 provide a capacitive divider between +V and ground with an additional voltage drop $V_d$ associated with the forward conduction of the first diode D1. In general $V_d$ will be relatively small because of the relatively small currents involved. The voltage on pin P3 is the voltage on Cx1. This depends on the relative capacitances Cs and Cx1. (I.e. $V(Cx1)=(V-V_d)*Cs/(Cs+Cx1)$). In general there will also be a dependence on the capacitance between the pins P2 and P3 and ground, e.g. though internal chip capacitive coupling and other stray capacitances. However, for the purposes of this explanation it will be assumed these stray capacitances are small and may be ignored. The existence of these stray capacitances does not significantly impact the overall operation of embodiments of the invention. I.e. the voltage on pin P3 (voltage on Cx1) may be reasonably be said to be $V(Cx1)\sim V*Cs/(Cs+Cx1)$ by ignoring other circuit capacitances and the voltage drop $V_d$. The voltage on pin P2 is the voltage on Cx1 plus the voltage drop of the first diode D1 (I.e. $V(P2)$ $(V(Cx1)+V_d)$). The voltage across the sample capacitor Cs is V(Cs) where V(Cs)=V−V(P2). I.e. $V(Cs)=(V-V_d)*(Cx/(Cs+Cx))$. This voltage is unaffected by the capacitance Cx2 of the second sense electrode 24-2 because of the blocking effect of the reverse-biased second diode D2 caused by the bias signal applied by pin P4 being driven high.

Figures 1, 2:
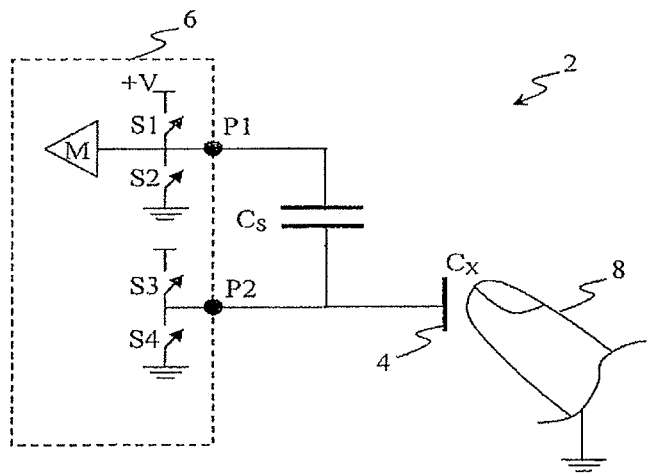
FIG. 1 schematically shows a known single-channel capacitive sensor.
FIG. 2 is a table schematically representing a switch operating sequence for the capacitive sensor of FIG. 1.

Step 3 (represented in FIG. 6C) is a measuring step for the first sense electrode 24-1. In step 3 switch S7 remains closed to maintain the non-conducting biasing of the second diode D2. The only other closed switches in this step are switches S4 and S6. Thus pin P1 is free to float, pins P2 and P3 are driven low, and pin P4 remains driven high. Driving pin P3 low means the charge on Cx1 is removed (sunk to ground). Driving pin P2 low means that P1 achieves the voltage V(Cs) established across the sample capacitor Cs during the charging step 2. Thus the voltage on pin P1 is $V(Cs)=(V-V_d)*(Cx1/(Cs+Cx1))$. The voltage on P1 thus depends on the capacitance of the sense capacitor Cx1 provided by the first sense electrode 24-1. In a manner broadly similar to that described above for the single-channel senor 2 of FIG. 1, this voltage on pin P1 could in principle be measured to provide an indication of the capacitance of the first sense capacitor. However, in practice the voltage V(Cs) provided by the single charging cycle in step 2 will be small (because Cx1<<Cs). Thus to provide a more robust measure of capacitance Cx1 the senor 2 is operable to repeatedly execute steps 2 and 3 (i.e. without performing the reset step 1). In each repetition of steps 2 and 3 a discrete increment of charge is added to the sample capacitor. Thus the voltage V(Cs) after each iteration of steps 2 and 3 increases asymptotically in dependence on the magnitude of the first sense capacitor Cx1 (the increase is asymptotic because less charge is added in subsequent iterations because of the charge already on the sample capacitor Cs). Throughout this burst of charging cycles the second diode is maintained in its non-conducting state (switch S7 closed to drive pin P4 high). Thus the capacitance of the second sense electrode has no affect on the transfer of charge to the sample capacitor in transitions of the driving signal, and only the capacitance of the first sense electrode affects this.

In some embodiments the voltage on pin P1 may be measured and taken as an indicator of Cx1 after a fixed number of charge cycles (i.e. a burst of repetitions of steps 2 and 3) has been performed. This can work well, but requires the measurement channel M of the microcontroller 16 to have the capability of measuring an analogue voltage. Thus in this embodiment instead of bursting for a fixed number of cycles/voltage transitions, the controller is configured to keep bursting (i.e. keep iterating steps 2 and 3) until the voltage V(Cs) reaches a measurement threshold $M_{thresh}$. The measurement threshold $M_{thresh}$ might, for example, be around half the voltage swing associated with the drive signal transitions, e.g. $M_{thresh}=V/2$. The number of charging cycles required for the voltage across the sample capacitor Cs to exceed the measurement threshold (as determined by a simple comparator) is an (inverse) measurement of the capacitance to ground of the first sense electrode. This "variable burst length" scheme has the advantage over "fixed burst length" schemes of using a comparator instead of a more complex voltage measurement function. Nonetheless, either scheme might equally be used.

Thus as indicated in the table of FIG. 5, steps 2 and 3 are repeated until V(Cs) exceeds the threshold $M_{thresh}$ (as determined by a comparator within the measurement channel M). If this takes n1 cycles (i.e. 2n1 steps in repeat, which is equivalent to 1+2n1 steps overall with the initial reset step 1), n1 provides an inverse measure of the capacitance of the first sense electrode to ground. This completes the measurement of the capacitance of the first sense electrode to ground (at least for the current acquisition cycle). In general the value n1 will be simply treated as an inverse proxy for capacitance, e.g. for use in determining if the measured capacitance has changed from a previous acquisition iteration, or for comparing with another measured capacitance from another sense channel. That is to say, there will in general be no attempt to convert the measured parameter n1 which is taken to be indicative of the capacitance to a fully calibrated capacitance value, e.g. in units of Farads. However, the details of the specific use, and of any subsequent processing, of the measured parameters indicative of sense electrode capacitances will depend on the application at hand and are not significant for understanding the invention.

Having measured the capacitance Cx1 of the first sense electrode (i.e. having measured a parameter (n1) that depends on the capacitance), the sensor 22 proceeds to measure the capacitance Cx2 of the second sense electrode. Measuring the capacitance Cx1 of the first sense electrode takes 1+2n1 steps (i.e. n1 repeated charge-measure cycles with two steps per cycle, plus the initial reset step 1). Thus referring to the table shown in FIG. 5, measurement of the capacitance Cx2 of the second sense electrode starts at step 1+2n1+1 (i.e. the first step after the completing the measurement of the capacitance of the first electrode).

The measurement of the capacitance of the second electrode closely mirrors the measurement of the capacitance of the first sense electrode. However, when measuring the capacitance of the second sense electrode, switches S1 to S4 operate in the same sequence as in the corresponding steps when measuring the capacitance of the first electrode, but the sequences of switches S5 and S6 are swapped with the sequences of switches S7 and S8.

Thus step 1+2n1+1 (identical to step 1 and represented in FIG. 6A) is another initialisation/reset step. Switches S2, S4, S6 and S8 are closed so that pins P1, P2, P3 and P4 are all driven low. This grounds both sense electrodes 24-1, 24-2 and shorts out the sample capacitor Cs so no residual charge remains on any of the capacitors.

Step 1+2n1+2 (represented in FIG. 6D) is a charging step for the second sense channel associated with the second sense electrode. In this step switches S1 and S5 are closed. All the other switches are open. Thus pins P1 and P3 are driven high while pins P2 and P4 are free to float. The voltage +V provided on pin P1 thus charges the in-series combination of the sample capacitor Cs and the second sense capacitor Cx2 provided by the capacitance of the second sense electrode to ground. This charging relies on forward conduction of the drive signal by the second diode D2. The drive signal is not conducted by the first diode D1 because pin P3 is driven high to provide a bias signal that prevents the first diode D1 from forward conducting the drive signal.

Thus in step 1+2n1+2 the sample capacitor Cs and the second sense capacitor Cx2 provide a capacitive divider between +V and ground (in series with an additional voltage drop $V_d$ associated with forward conduction of the second diode D2—assumed here to be same as that for the first diode). The voltage on pin P4 is the voltage on Cx2. This depends on the relative capacitances Cs and Cx2. (I.e. $V(Cx2)=(V-V_d)*Cs/(Cs+Cx2))$. The voltage on pin P2 is the voltage on Cx2 plus the voltage drop of the second diode D2 (I.e. $V(P2)=(V(Cx2)+V_d)$. The voltage across the sample capacitor Cs is V(Cs) where V(Cs)=V−V(P2). I.e. $V(Cs)=(V-V_d)*(Cx2/(Cs+Cx2))$. This voltage is unaffected by the capacitance Cx1 of the first sense electrode 24-1 because of the blocking effect of the reverse-biased first diode D1 caused by the bias signal applied by pin P3 being driven high.

Step 1+2n1+3 (represented in FIG. 6E) is a measuring step for the second sense electrode 24-2. In step 1+2n1+3 switch S5 remains closed to maintain the non-conducting biasing of the first diode D1. The only other closed switches in this step are switches S4 and S8. Thus pin P1 is free to float, pins P2 and P4 are driven low, and pin P3 remains driven high. Driving pin P4 low means the charge on Cx2 is removed (sunk to ground). Driving pin P2 low means that P1 achieves the voltage V(Cs) established across the sample capacitor Cs during the charging step 2n+2. Thus the voltage on pin P1 is $V(Cs)=(V-V_d)*(Cx2/(Cs+Cx2))$. The voltage on P1 thus depends on the capacitance of the sense capacitor Cx2 provided by the first sense electrode 24-2. In a manner similar to that described above for the first sense channel associated with the first sense electrode, the senor 22 is operable to repeatedly execute steps 2n+2 and 2n+3 (without performing the reset step 2n+1). In each repetition a discrete increment of charge is added to the sample capacitor. Throughout this burst of charging cycles the first diode is maintained in its non-conducting state (switch S5 closed to drive pin P3 high). Thus the capacitance of the first sense electrode has no affect on the transfer of charge to the sample capacitor in transitions of the driving signal, and only the capacitance of the second sense electrode affects this.

The controller is again configured to keep bursting (i.e. keep iterating steps 1+2n1+2 and 1+2n1+3) until the voltage V(Cs) reaches the measurement threshold $M_{threth}$. Thus as indicated in the table of FIG. 5, steps 1+2n1+2 and 1+2n1+3 are repeated until V(Cs) exceeds the threshold $M_{thresh}$ (as determined by a comparator within the measurement channel M). Assuming this takes n2 cycles (i.e. 2n2 steps), n2 provides an inverse measure of the capacitance of the second sense electrode to ground. This completes the measurement of the capacitance of the second sense electrode to ground (for the current acquisition cycle). Accordingly, after 1+2n1+1+2n2 steps both capacitances Cx1 and Cx2 have been measured and the current measurement acquisition cycle is complete. The number of steps of 1+2n1+1+2n2 comes from the n1 and n2 repeat cycles for the first and second sense electrodes plus the two reset/initialisation steps.

Thus as described above the sensor 22 of FIG. 4 is operable to measure the capacitance of first and second sense electrodes using the general principles of charge transfer techniques. However, this is done in a modified manner in which a single sample capacitor and a single drive channel are used for both measurement channels. Depending on the specific application at hand the microcontroller may be configured to output the signals to a master device controller for a device in which the sensor is implemented, and then, either immediately or after a delay, repeat the capacitance measurements in another acquisition cycle.

It will be appreciated that the individual measurements of capacitance for each channel are in many respects similar to the manner in which conventional charge-transfer capacitance measurement schemes operate. Accordingly, it will be understood that various features of charge transfer sensing which are not described here in the interest of brevity can readily be used in conjunction with embodiments of the invention. For example, any known signal processing schemes, e.g. for drift compensation, filtering, etc., and schemes such as auto-switch on/off and so on, can be employed in accordance with embodiments of the invention. Furthermore, the typical considerations when determining circuit component values and timings, will be well understood from conventional charge-transfer technology, for example as described in U.S. Pat. Nos. 5,730,165 and 6,466,036, both of which are incorporated herein in their entirety by reference.

A typical application of a dual-channel sensor of the kind shown in FIG. 4 might be for measuring capacitance on the order Cx1=Cx2=4 pF, and employ a sample capacitor having a value Cs=2 nF. The diodes may be conventional small signal diodes, such as IN4148 diodes. The controller might be a suitably programmed Tiny44 microcontroller available from Atmel Corporation. The logic-high voltage +V might typically be 3 V. The measurement threshold $M_{thresh}$ might typically be 1.5 V. The duration of each step in the timing sequence might typically be around 5 µs for charging and measuring, and around 500 µs for reset. The number of cycles required to reach the threshold in a single capacitance measurement obviously depends on the capacitance being measured, but might typically be on the order of 300. Thus a single capacitance measurement might take around 3 ms to complete.

It will be appreciated that in practice the microcontroller may be configured to provide a brief gap between steps. This is so that during this gap, switches which are closed from the previous step may be opened before any open switches are closed for the next step. This can help ensure, for example referring to FIG. 5, that the sample capacitor Cs is not accidentally fully charged to +V between steps 2 and 3 by switch S4 closing before switch S1 opens.

It will be appreciated that the above describe principles may be extended to multi-channel sensors having greater than two sense channels.

Figure 7:
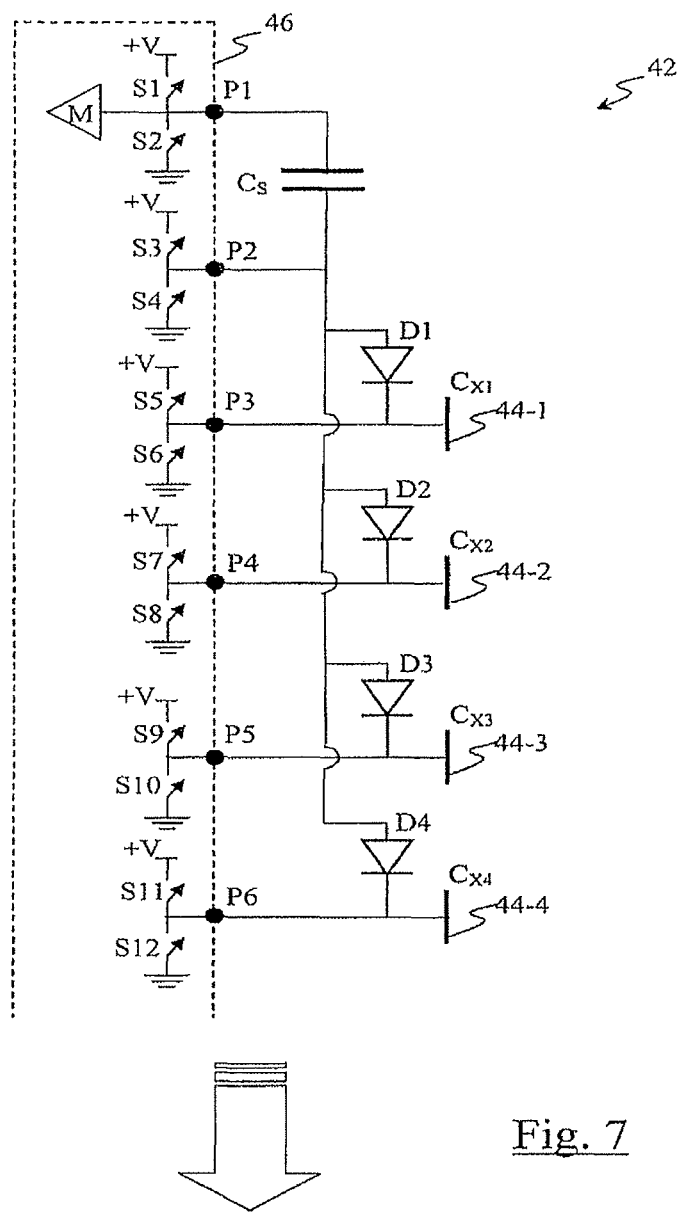
FIG. 7 schematically shows a four-channel capacitive sensor according to an embodiment of the invention.

FIG. 7 schematically shows a multi-channel capacitive sensor 42 according to an embodiment of the invention. The sensor 42 in this example is a quad-channel sensor, but may in effect be infinitely extended to higher numbers of channels, as schematically indicated by the arrow at the bottom of the figure.

Thus the sensor 42 is for measuring the capacitances of first to fourth sense electrodes 44-1 to 44-4 to a system reference potential (ground). This quad-channel sensor 42 is an extension of the dual-channel sensor shown 22 in FIGS. 4 to 6 and its basic operation will be understood from the above description of the dual-channel sensor 22. In addition to the four sense electrodes 44-1 to 44-4 the sensor 42 comprises a microcontroller 46, a sample capacitor Cs, and first to fourth diodes D1-D4. As before the microcontroller 46 is a general purpose programmable device configured, in conjunction with the sample capacitor Cs and diodes D1-D4, to provide signals indicative of the capacitances of each of the four sense electrodes.

The provision of the four sensing channel requires the use of six pins of the microcontroller 46. These are labelled P1 to P6 in FIG. 7. As before the pins of the microcontroller 46 may be driven high or low. This is schematically represented in FIG. 7 by a series of twelve switches S1 to S12 within the microcontroller 46. Pins P1 to P4 are coupled to the sample capacitor Cs, the first and second diodes D1, D2, and the first and second sense electrodes 44-1, 44-2 in the same way as these elements are coupled together in the dual-channel sensor 22 of FIG. 4.

The third diode D3 has a first terminal and a second terminal. In this example the first terminal is the anode and the second terminal is the cathode. The anode of the third diode is electrically coupled to the second terminal of the sample capacitor (and hence also coupled to pin P2 of the microcontroller 46 and the anodes of the other diodes D1, D2, D4). The cathode of the third diode D3 is coupled to the first sense electrode 44-1 and also to pin P5 of the microcontroller 46.

The fourth diode D4 has a first terminal and a second terminal. In this example the first terminal is the anode and the second terminal is the cathode. The anode of the fourth diode D4 is electrically coupled to the second terminal of the sample capacitor (and hence also coupled to pin P2 of the microcontroller 46 and the anodes of the other diodes D1 to D3). The cathode of the fourth diode D4 is coupled to the fourth sense electrode 44-4 and also to pin P6 of the microcontroller 46.

The quad-channel sensor 42 measures the capacitances of the respective sense electrodes in turn. The first two are in effect measured in the same way as described above for the dual channel sensor and using the sequence represented in FIG. 5 for these electrodes. During these first two measurements the third and fourth diodes (along with the relevant one of the first and second diodes depending on which capacitance is being measured) are provided with a bias signal so they do not conduct the drive signal to their respective sense electrodes (i.e. pins P5 and P6 are maintained high).

The capacitances of the additional sense electrodes are measured according to the same principles. Thus to measure the capacitance of the third sense electrode, pins P1 to P3 are driven in the same way as for measuring the capacitance of the second electrode (see setting for switches S1 to S6 steps 1+2n+1 to 1+2n+3 in FIG. 5). However, when sampling the third sense electrode's capacitance, pin P4 is kept high (to prevent the second diode D2 from conducting) and pin P5 is driven in the same way as pin P4 is driven when measuring the capacitance of the second sense electrode (i.e. switches S9 and S10 are activated in accordance with the setting for switches S7 and S8 in steps 1+2n+1 to 1+2n+3 of FIG. 5). Pin P6 is maintained high throughout (switch S11 closed) to prevent the fourth diode D4 from conducting.

Similarly, to measure the capacitance of the fourth sense electrode, pins P3 to P6 are all held high to prevent the first to third diodes D1 to D3 conducting, pins P1 and P2 are driven in the same way as when measuring the other capacitances, and pin P6 is driven in the same was as pin P4 is driven when measuring the capacitance of the second sense electrode (i.e. switches S11 and S12 are activated in accordance with the setting for switches S7 and S8 in steps 1+2n+1 to 1+2n+3 of FIG. 5).

This principle can be extended to include any number of measurement channels. Each additional channel requires only one more control circuit connection/microcontroller pin (i.e. a connection to apply a bias signal for the diode of the additional circuit and to ground out charge for the addition sense electrode). Thus for an m-channel sensor the total number of control circuit connections is 2+m. With a conventional multi-channel sensor of the kind shown in FIG. 2, however, each channel independently requires two control circuit connections. Thus a conventional m-channel sensor requires a total number of 2 m control circuit connections. Thus a tri-channel sensor (and above) according to embodiments of the present invention needs fewer control circuit connections than a corresponding multi-channel sensor employing conventional techniques. This is a significant advantage in many applications where it is often desirable to derive as much functionality as possible out of as few control circuit connections (e.g. microcontroller pins) as possible. For example, a microcontroller having eight available pins for capacitance measurement can provide four sense channels in accordance with conventional techniques, but can provide six sense channels in accordance with embodiments of the invention. Thus a more complex user interface, for example, can be supported by the same microcontroller operating in accordance with embodiments of the invention because more "buttons" (i.e. six buttons vs. four buttons) can be provided.

It will be appreciated that the above description in terms of switches is primarily in the context of a microcontroller providing various output pins that may be driven high or low. However in principle a circuit employing discrete switches (transistors) could be used. In this case it may be noted that not all switches represented in FIG. 4 would be needed. For example, switch S3 is never closed since pin P2 is only ever driven low or allowed to float. Switch S3 is nonetheless shown in FIG. 4 in keeping with the fact a microcontroller implementation would generally have the ability to drive pin P2 high, even though it is not required to do so in this embodiment. In a discrete circuit element implementation one could simply omit switch S3.

It will also be appreciated that while above examples have focused on a positive going drive signals, embodiments of the invention could equally be based on negative going drive signals, i.e. from the system reference potential to −V. This may be achieved by reversing the diodes' directions and providing a −V signal as the bias signal.

Thus there has been described a multi-channel capacitive sensor for measuring the capacitances of a plurality of sense electrodes to a system reference potential. The sensor comprises a sample capacitor having a first terminal and a second terminal, a first diode having a first terminal coupled to the second terminal of the sample capacitor and a second terminal coupled to a first sense electrode, and a second diode having a first terminal coupled to the second terminal of the sample capacitor and a second terminal coupled to a second sense electrode. The sample capacitor and diodes are coupled to a control circuit, e.g. implemented in a microcontroller. The control circuit is operable to apply a drive signal, e.g. a series of voltage pulses, to the first terminal of the sample capacitor while simultaneously applying a bias signal to the second terminal of one or other of the diodes to prevent the diode from conducting the drive signal. Thus charge transfer techniques can be used to measure multiple capacitances while sharing a common sample capacitor. This helps reduce inter-channel drift. Further measurement channels may be added by providing further diodes and corresponding sense electrodes. With three or more channels the scheme requires only one additional control circuit connection per additional channel.

It will be further be appreciated that features described above in connection with aspects of the invention will often be equally applicable to, and may be combined with, other aspects of the invention. In particular, features of embodiments of the invention may be combined in any appropriate way and not just in the specific combinations recited in the attached claims.

The invention claimed is:

1. A multi-channel capacitive sensor comprising:
first and second sense capacitors;
first and second diodes;
a sample capacitor; and
a control circuit configured to:
    ground the first and second sense capacitors;
    charge, by a first voltage provided on a pin of the control circuit, the sample capacitor and the first sense capacitor using forward conduction of a drive signal by the first diode;
    reverse bias the second diode to prevent charging of the second sense capacitor during said charging of the sample capacitor and the first sense capacitor; and
    measure a second voltage on the pin of the control circuit resulting at least in part from said charging the sample capacitor and the first sense capacitor, wherein the second voltage provides an indication of a capacitance of the first sense capacitor.

2. The multi-channel capacitive sensor of claim 1, wherein the control circuit is further configured to:
ground the first sense capacitor and the second sense capacitor after charging the sample capacitor and the first sense capacitor;
charge, by a third voltage provided on the pin of the control circuit, the sample capacitor and the second sense capacitor while not charging the first sense capacitor by the third voltage provided on the pin of the control circuit; and
measure a fourth voltage on the pin of the control circuit resulting at least in part from charging the sample capacitor and the second sense capacitor, wherein the fourth voltage provides an indication of a capacitance of the second sense capacitor.

3. The multi-channel capacitive sensor of claim 1, wherein the control circuit is further configured to repeat the charging and measuring operations until the measured second voltage exceeds a measurement threshold.

4. The multi-channel capacitive sensor of claim 1, wherein the control circuit is further configured to provide a bias signal, by a second pin of the control circuit, to prevent the second diode coupled to the second sense capacitor from forward conducting a drive signal to the second sense capacitor.

5. The multi-channel capacitive sensor of claim 1, wherein the control circuit is further configured to compare the capacitance of the first sense electrode with a capacitance of a second sense electrode.

6. The multi-channel capacitive sensor of claim 1, wherein the control circuit is further configured to provide a time gap between charging the sample capacitor and the first sense capacitor and measuring the second voltage.

7. The multi-channel capacitive sensor of claim 1, wherein the control circuit is further configured to ground the first sense capacitor while measuring the second voltage.

8. A non-transitory computer-readable medium comprising logic, the logic when executed by one or more processors configured to cause the one or more processors to perform operations comprising:
grounding a first sense capacitor and a second sense capacitor of a multi-channel capacitive sensor;
charging, by a first voltage provided on a pin of a controller, a sample capacitor and the first sense capacitor using forward conduction of a drive signal by a first diode coupled to the first sense capacitor;
reverse biasing a second diode coupling the second sense capacitor to the pin of the control circuit having the first voltage, to prevent charging of the second sense capacitor during said charging of the sample capacitor and the first sense capacitor; and
measuring a second voltage on the pin of the controller resulting at least in part from charging the sample capacitor and the first sense capacitor, wherein the second voltage provides an indication of a capacitance of the first sense capacitor.

9. The non-transitory computer-readable medium of claim 8, wherein the operations further comprise:

grounding the first sense capacitor and the second sense capacitor after charging the sample capacitor and the first sense capacitor;

charging, by a third voltage provided on the pin of the controller, the sample capacitor and the second sense capacitor while not charging the first sense capacitor by the third voltage provided on the pin of the controller; and measuring a fourth voltage on the pin of the controller resulting at least in part from charging the sample capacitor and the second sense capacitor, wherein the fourth voltage provides an indication of a capacitance of the second sense capacitor.

10. The non-transitory computer-readable medium of claim 8, wherein the operations further comprise repeating the charging and measuring operations until the measured second voltage exceeds a measurement threshold.

11. The non-transitory computer-readable medium of claim 8, wherein the operations further comprise providing a bias signal, by a second pin of the controller, to prevent the second diode coupled to the second sense capacitor from forward conducting a drive signal to the second sense capacitor.

12. The non-transitory computer-readable medium of claim 8, wherein the operations further comprise comparing the capacitance of the first sense electrode with a capacitance of a second sense electrode.

13. The non-transitory computer-readable medium of claim 8, wherein the operations further comprise providing a time gap between charging the sample capacitor and the first sense capacitor and measuring the second voltage.

14. The non-transitory computer-readable medium of claim 8, wherein the operations further comprise grounding the first sense capacitor while measuring the second voltage.

15. A method, comprising:

grounding a first sense capacitor and a second sense capacitor of a multi-channel capacitive sensor;

charging, by a first voltage provided on a pin of a controller, a sample capacitor and the first sense capacitor using forward conduction of a drive signal by a first diode coupled to the first sense capacitor;

reverse biasing a second diode coupling the second sense capacitor to the pin of the control circuit having the first voltage, to prevent charging of the second sense capacitor during said charging of the sample capacitor and the first sense capacitor; and measuring a second voltage on the pin of the controller resulting at least in part from charging the sample capacitor and the first sense capacitor, wherein the second voltage provides an indication of a capacitance of the first sense capacitor.

16. The method of claim 15, further comprising:

grounding the first sense capacitor and the second sense capacitor after charging the sample capacitor and the first sense capacitor;

charging, by a third voltage provided on the pin of the controller, the sample capacitor and the second sense capacitor while not charging the first sense capacitor by the third voltage provided on the pin of the controller; and measuring a fourth voltage on the pin of the controller resulting at least in part from charging the sample capacitor and the second sense capacitor, wherein the fourth voltage provides an indication of a capacitance of the second sense capacitor.

17. The method of claim 15, further comprising repeating the charging and measuring operations until the measured second voltage exceeds a measurement threshold.

18. The method of claim 15, further comprising comparing the capacitance of the first sense electrode with a capacitance of a second sense electrode.

19. The method of claim 15, further comprising providing a time gap between charging the sample capacitor and the first sense capacitor and measuring the second voltage.

20. The method of claim 15, further comprising grounding the first sense capacitor while measuring the second voltage.

* * * * *